(12) United States Patent
Cao et al.

(10) Patent No.: US 10,938,080 B2
(45) Date of Patent: Mar. 2, 2021

(54) COMBINER AND ANTENNA APPARATUS

(71) Applicant: Huawei Technologies Co., Ltd., Shenzhen (CN)

(72) Inventors: Jianwei Cao, Dongguan (CN); Jianhua Wu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/394,789

(22) Filed: Apr. 25, 2019

(65) Prior Publication Data

US 2019/0252747 A1    Aug. 15, 2019

Related U.S. Application Data

(63) Continuation of application No. PCT/CN2017/107503, filed on Oct. 24, 2017.

(30) Foreign Application Priority Data

Oct. 25, 2016 (CN) .......................... 201621165028.1

(51) Int. Cl.
     *H01P 1/20*      (2006.01)
     *H01P 5/16*      (2006.01)
     *H05K 1/02*      (2006.01)
     *H05K 7/14*      (2006.01)
     *H01P 7/04*      (2006.01)
     *H01Q 1/50*      (2006.01)

(52) U.S. Cl.
     CPC .................. *H01P 1/20* (2013.01); *H01P 5/16* (2013.01); *H01P 7/04* (2013.01); *H01Q 1/50* (2013.01); *H05K 1/0231* (2013.01); *H05K 1/0237* (2013.01); *H05K 7/1427* (2013.01)

(58) Field of Classification Search
     CPC ..... H01P 1/20; H01P 5/16; H01P 7/04; H01Q 1/50; H05K 1/0231; H05K 1/0237; H05K 7/1427
     USPC ......................................................... 333/136
     See application file for complete search history.

(56) References Cited

U.S. PATENT DOCUMENTS

| | | | |
|---|---|---|---|
| 2,181,901 A | 12/1939 | Lindenblad | |
| 10,116,031 B2 * | 10/2018 | Li | ................ H01R 24/44 |
| 2002/0145490 A1 | 10/2002 | Sauder et al. | |

FOREIGN PATENT DOCUMENTS

| | | |
|---|---|---|
| CN | 102354780 A | 2/2012 |
| CN | 102544650 A | 7/2012 |
| CN | 203288725 U | 11/2013 |

(Continued)

*Primary Examiner* — Robert J Pascal
*Assistant Examiner* — Kimberly E Glenn
(74) *Attorney, Agent, or Firm* — Leydig, Voit & Mayer, Ltd.

(57) ABSTRACT

A combiner is provided and belongs to the communications field. The combiner includes a conductive housing, a printed circuit board PCB, a conductive column, and a first conductor. The PCB, the conductive column, and the first conductor are located inside the conductive housing; one end of the conductive column is fastened to a bottom part of the conductive housing, the PCB is fastened to a top part of the conductive housing, and the first conductor is fastened to the PCB; and an axial direction of the first conductor is parallel to an axial direction of the conductive column, and a partial region of a side surface of the first conductor is opposite to the conductive column.

20 Claims, 11 Drawing Sheets

(56) References Cited

FOREIGN PATENT DOCUMENTS

| | | |
|---|---|---|
| CN | 203351722 U | 12/2013 |
| CN | 104269592 A | 1/2015 |
| CN | 206236769 U | 6/2017 |
| EP | 1033774 A1 | 9/2000 |
| EP | 2882033 A1 | 6/2015 |
| WO | 1999036983 A1 | 7/1999 |

* cited by examiner

COMBINER AND ANTENNA APPARATUS

CROSS-REFERENCE TO RELATED APPLICATIONS

This application is a continuation of International Application No. PCT/CN2017/107503, filed on Oct. 24, 2017, which claims priority to Chinese Patent Application No. 201621165028.1, filed on Oct. 25, 2016. The disclosures of the aforementioned applications are hereby incorporated by reference in their entireties.

TECHNICAL FIELD

Embodiments of the present application relate to the communications field, and in particular, to a combiner and an antenna apparatus.

BACKGROUND

A combiner is a device that can combine a plurality of signals of different frequencies to a same outlet for output. The combiner can be applied to an antenna, and is usually integrated into the antenna. The antenna usually receives signals of different frequencies, and outputs the signals of different frequencies from a same outlet one by one by using the combiner integrated into the antenna.

Referring to FIG. 1, there is a type of combiner currently. The combiner includes a metal housing 1, a PCB (printed circuit board) 2, a copper foil 3, and a metal column 4. The PCB 2, the copper foil 3, and the metal column 4 are located inside the metal housing 1; the metal column 4 is fastened to a bottom part of the metal housing 1; the PCB 2 is fastened to a top part of the metal housing 1, the copper foil 3 is fastened to the PCB 2; a partial region of the copper foil 3 is opposite to an end surface of the metal column 4; and the partial region and the end surface of the metal column 4 form a capacitor structure. After receiving signals of different frequencies, an antenna inputs the signals of different frequencies to the combiner, and the signals of different frequencies are transmitted one by one in the combiner. For a signal of any frequency, the signal is mixed with a signal of another frequency. When the signal of the any frequency flows through the partial region that is of the copper foil 3 and that is opposite to the end surface of the metal column 4, the capacitor structure formed by the partial region and the end surface of the metal column 4 filters the signal of the another frequency mixed in the signal of the any frequency, to isolate the signal of the any frequency from the signal of the another frequency, and output the signal of the any frequency from an outlet of the combiner.

In a process of implementing the present application, the inventor found that the prior art has at least the following problems:

Because an area of the end surface of the metal column 4 is relatively small, the capacitor structure formed by the end surface and the partial region of the copper foil 3 has a small size, and capacitance intensity of the capacitor structure is relatively small. As a result, only some of signals of other frequencies mixed in the signal can be filtered out, the signal cannot be isolated from a signal of another frequency, so that the combiner has relatively low isolation.

SUMMARY

To increase isolation of a combiner without changing a size of the combiner, the present application provides a combiner and an antenna apparatus.

According to a first aspect, an embodiment of this application provides a combiner, where the combiner includes a conductive housing, a printed circuit board (PCB), a conductive column, and a first conductor; the PCB, the conductive column, and the first conductor are located inside the conductive housing; one end of the conductive column is fastened to a bottom part of the conductive housing, the PCB is fastened to a top part of the conductive housing, and the first conductor is fastened to the PCB; and an axial direction of the first conductor is parallel to an axial direction of the conductive column, and a partial region of a side surface of the first conductor is opposite to the conductive column. In this way, the first conductor may be opposite to a side surface and another part of the conductive column. Because an area of the side surface and another part of the conductive column is larger than that of an end part of the conductive column, a size of a capacitor structure formed between the side surface of the first conductor and the conductive column can be increased, so as to increase capacitance intensity of the capacitor structure, and increase isolation of the combiner without changing a size of the combiner. In addition, capacitance intensity of a capacitor structure formed between the first conductor and the conductive column can be flexibly changed by changing a size of the first conductor.

In a possible design, the first conductor is of a tubular structure, one end of the first conductor is fastened to the PCB, and a partial region of at least one of an inner side surface and an outer side surface of the first conductor is opposite to the conductive column. The first conductor of a tubular structure can make the inner side surface and/or the outer side surface of the first conductor opposite to the conductive column. In this case, the size of the capacitor structure formed between the side surface of the first conductor and the conductive column can be increased.

In a possible design, the combiner further includes a second conductor, where the second conductor is fastened to an inner side surface of the first conductor, and a partial region of a side surface of the second conductor is opposite to an end surface of the other end of the conductive column. In this way, not only a partial region of the first conductor is opposite to the conductive column, but also a partial region of the second conductor is opposite to the conductive column. This further increases the size of the capacitor structure formed in the combiner, so as to further increase the isolation of the combiner without changing the size of the combiner.

In a possible design, a tubular groove is disposed in the end surface of the other end of the conductive column, and the other end of the first conductor extends into the tubular groove. The tubular groove is disposed in the end surface of the other end of the conductive column, to divide the other end of the first conductor into a column center part located inside the tubular groove and a periphery part located outside the tubular groove; and the other end of the first conductor extends into the tubular groove. Therefore, not only a partial region of the inner side surface of the first conductor is opposite to the column center part, but also a partial region of the outer side surface of the first conductor is opposite to the periphery part. This further increases the size of the capacitor structure formed between the first conductor and the conductive column, so as to further increase the isolation of the combiner without changing the size of the combiner.

In a possible design, the first conductor is of a sheet structure, and an upper edge of the first conductor is fastened to the PCB; and a groove is disposed in an end surface of the other end of the conductive column, and a lower edge of the first conductor extends into the groove. In this way, a partial region of a side surface of the first conductor is opposite to the column center part, and a partial region of another side surface of the first conductor is opposite to the periphery part. This further increases the size of the capacitor structure formed between the first conductor and the conductive column, so as to further increase the isolation of the combiner without changing the size of the combiner.

In a possible design, the first conductor includes a first conductive sheet and a second conductive sheet, and the first conductive sheet and the second conductive sheet cross with each other; both an upper edge of the first conductive sheet and an upper edge of the second conductive sheet are fastened to the PCB; and a first groove and a second groove are disposed in the end surface of the other end of the conductive column, the first groove and the second groove cross with each other, a lower edge of the first conductive sheet extends into the first groove, and a lower edge of the second conductive sheet extends into the second groove. In this way, a partial region of a side surface of the first conductive sheet is opposite to the column center part, and a partial region of another side surface of the first conductive sheet is opposite to the periphery part; and a partial region of a side surface of the second conductive sheet is also opposite to the column center part, and a partial region of another side surface of the second conductive sheet is also opposite to the periphery part. This greatly increases the size of the capacitor structure formed between the first conductor and the conductive column, so as to further greatly increase the isolation of the combiner.

In a possible design, the combiner further includes a third conductor, the third conductor is fastened to a side surface that is close to the conductive column and that is of the PCB, and the third conductor is connected to the first conductor. The third conductor has a guiding function. A signal in the PCB can be transmitted to the first conductor through guiding of the third conductor.

In a possible design, the third conductor includes a third conductive sheet and a fourth conductive sheet, and each of the third conductive sheet and the fourth conductive sheet is fastened to a side surface that is close to the conductive column and that is of the PCB; and both the third conductive sheet and the fourth conductive sheet are connected to the first conductor, and the first conductor is located between the third conductive sheet and the fourth conductive sheet. In this way, a signal in the PCB can be transmitted to the first conductor through one of the conductive sheets; and after first conductor filters the signal, the filtered signal is transmitted to the PCB through the other conductive sheet.

According to another aspect, an embodiment of this application provides an antenna apparatus, where the antenna apparatus includes at least one combiner connected in series, and each of the at least one combiner is the combiner according to any one of the foregoing designs. In this case, a first conductor in the combiner may be opposite to a side surface and another part of a conductive column. Because an area of the side surface and another part of the conductive column is larger than that of an end part of the conductive column, a size of a capacitor structure formed between a side surface of the first conductor and the conductive column can be increased, so as to increase capacitance intensity of the capacitor structure, and further increase isolation of the combiner.

BRIEF DESCRIPTION OF DRAWINGS

The accompanying drawings herein are incorporated into this specification and constitute a part of this specification, show embodiments conforming to the present application, and are used to explain a principle of the present application together with this specification.

DESCRIPTION OF EMBODIMENTS

To make the objectives, technical solutions, and advantages of the present application clearer, the following further describes implementations of the present application in detail with reference to accompanying drawings.

A current communications device such as a mobile terminal or a base station includes an antenna apparatus, where the antenna apparatus includes at least one combiner. The antenna apparatus may receive signals of different frequencies; and the at least one combiner outputs the signals of different frequencies from a same outlet to the communications device. Any one of the at least one combiner may be any combiner provided in the following embodiments.

Figure 1:
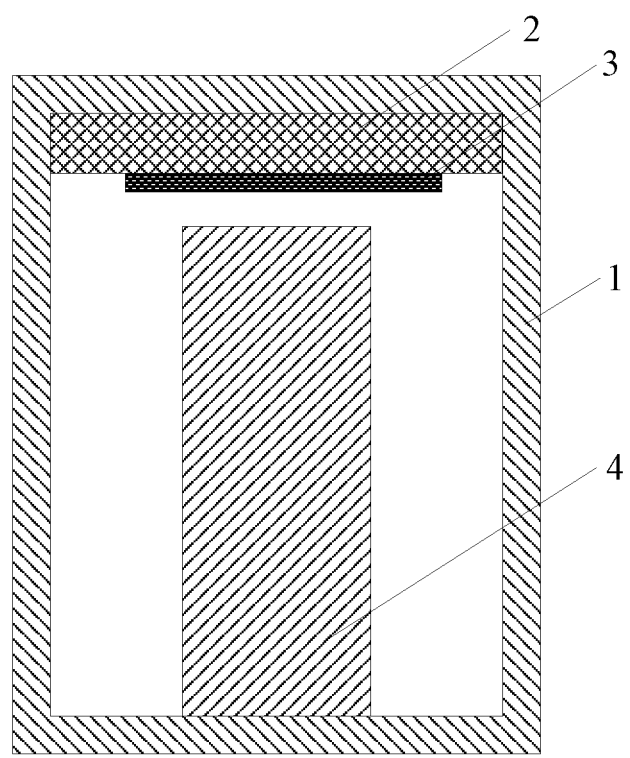
FIG. 1 is a section view of a combiner according to the prior art.
Figure 2:
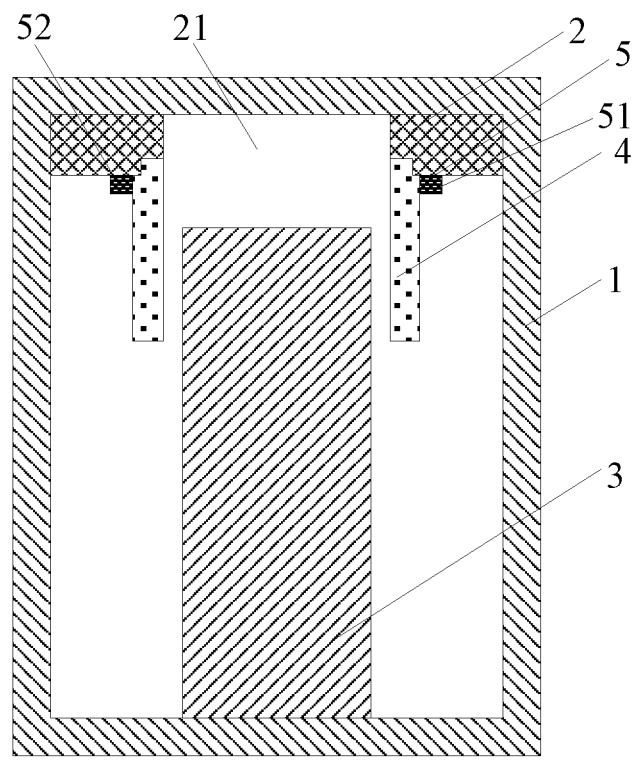
FIG. 2 is a section view of a combiner according to an embodiment of the present application.

Referring to FIG. 2, an embodiment of the present application provides a combiner, where the combiner includes:

a conductive housing 1, a PCB 2, a conductive column 3, and a first conductor 4, where the PCB 2, the conductive column 3, and the first conductor 4 are located inside the conductive housing 1;

one end of the conductive column 3 is fastened to a bottom part of the conductive housing 1, the PCB 2 is fastened to a top part of the conductive housing 1, and the first conductor 4 is fastened to the PCB 2; and an axial direction of the first conductor 4 is parallel to an axial direction of the conductive column 3, and a partial region of a side surface of the first conductor 4 is opposite to the conductive column 3.

The conductive housing 1 is of a hollow columnar structure; the end of the conductive column 3 is fastened to an inner side surface of the bottom part of the conductive housing 1; and a side surface of the PCB 2 is fastened to an inner side surface of the top part of the conductive housing 1. The conductive housing 1 may be of a hollow square columnar structure, a hollow cylindrical structure, or the like.

The first conductor 4 may be perpendicular to the PCB 2, and may be of a plurality of structures. For example, in this embodiment, two structures are enumerated, that is, the first conductor 4 may be of a tubular structure or the first conductor 4 may be of a sheet structure. The two types of structures of the first conductor 4 are described in detail in subsequent content.

In this embodiment, the axial direction of the first conductor 4 is parallel to the axial direction of the conductive column 3. In this way, the partial region of the side surface of the first conductor 4 may be opposite to the conductive column 3. For example, the partial region may be opposite to a side surface of the conductive column 3. Because an area of the side surface of the conductive column 3 is larger than that of the end part of the conductive column 3, a size of a capacitor structure formed between the side surface of the conductive column 3 and the partial region is increased, so as to further increase capacitance intensity of the capacitor structure. In this case, when a signal of a frequency in the PCB 2 is transmitted to the first conductor 4, the capacitor structure can better filter out a signal of another frequency from the signal, so as to increase isolation of the combiner without changing a size of the combiner.

Referring to FIG. 2, the combiner further includes a third conductor 5; the third conductor 5 is fastened to a side surface that is close to the conductive column 3 and that is of the PCB 2; and the third conductor 5 is connected to the first conductor 4. The third conductor 5 may be perpendicular to the first conductor 4.

The third conductor 5 includes a third conductive sheet 51 and a fourth conductive sheet 52; both the third conductive sheet 51 and the fourth conductive sheet 52 are fastened to a side surface that is close to the conductive column 3 and that is of the PCB 2; both the third conductive sheet 51 and the fourth conductive sheet 52 are connected to the first conductor 4; and the first conductor 4 is located between the third conductive sheet 51 and the fourth conductive sheet 52. Both the third conductive sheet 51 and the fourth conductive sheet 52 may be perpendicular to the first conductor 4.

The third conductive sheet 51 and the fourth conductive sheet 52 have a signal guiding function. A signal in the PCB 2 can be transmitted from one of the conductive sheets to the first conductor 4; and after the first conductor 4 filters the signal, the filtered signal is transmitted to the PCB 2 through the other conductive sheet.

At least one of the conductive housing 1, the conductive column 3, the first conductor 4, and the third conductor 5 may be made of metal. For example, the first conductor 4 may be a copper foil, and the third conductor 5 may also be a copper foil. In addition, the first conductor 4 and the third conductor 5 may be integrally molded.

The following describes in detail two structures of the first conductor 4, and detailed description is provided as follows:

For the first conductor 4 of the foregoing tubular structure, referring to FIG. 2, one end of the first conductor 4 is fastened to the PCB 2, and a partial region of at least one of an inner side surface and an outer side surface of the first conductor 4 is opposite to the conductive column 3.

Figure 3:
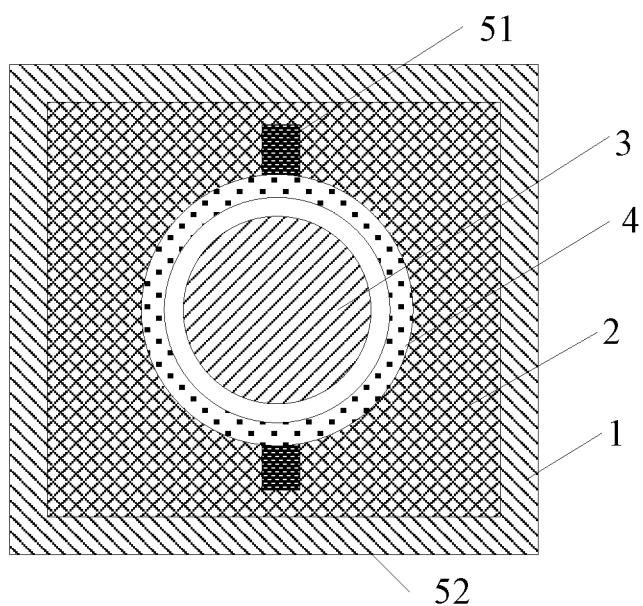
FIG. 3 is a section view of a top part of a combiner according to an embodiment of the present application.
Figure 4:
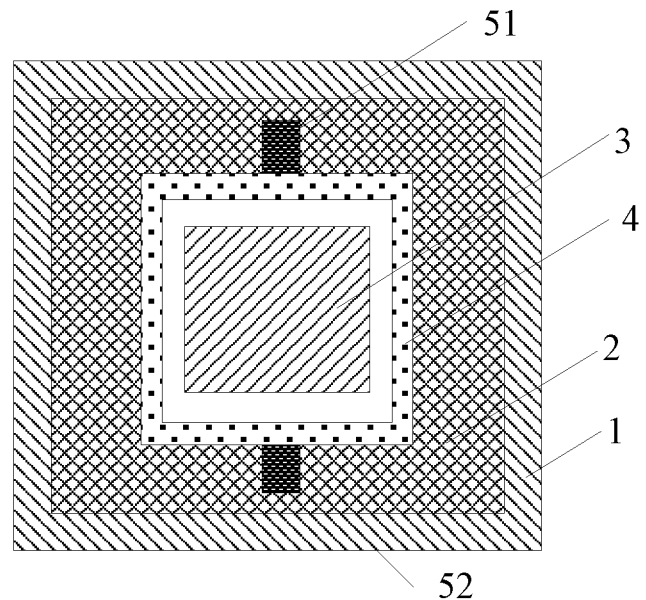
FIG. 4 is a section view of a top part of another combiner according to an embodiment of the present application.

Referring to FIG. 3 or FIG. 4, both the third conductive sheet 51 and the fourth conductive sheet 52 that are included in the third conductor 5 are connected to an outer side surface of the first conductor 4, and the first conductor 4 is located between the third conductive sheet 51 and the fourth conductive sheet 52.

An axis of the first conductor 4 is collinear with an axis of the conductive column 3, and the first conductor 4 may be perpendicular to each of the PCB 2, the third conductive sheet 51, and the fourth conductive sheet 52.

In an implementation in which the first conductor 4 is of a tubular structure, the PCB 2 may be further provided with an opening 21, and the opening 21 is communicated with the first conductor 4. The opening 21 may be flush with an inner side surface of the first conductor 4.

Optionally, there are the following two implementations, so that a partial region of at least one of the inner side surface and the outer side surface of the first conductor 4 is opposite to the conductive column 3, and the two implementations are provided separately as follows:

Referring to FIG. 2, in a first implementation, an area of a cross section of the first conductor 4 is larger than that of a cross section of the conductive column 3, and the other end of the conductive column 3 extends into the first conductor 4.

In the first implementation, a shape of the cross section of the first conductor 4 is the same as that of the cross section of the conductive column 3; the other end of the conductive column 3 extends from the other end of the first conductor 4 into the first conductor 4; a partial region of the inner side surface of the first conductor 4 is opposite to a side surface of the conductive column 3; and the partial region and a part of the side surface that is opposite to the partial region and that is of the conductive column 3 form a capacitor structure used to filter a signal.

Figure 5:
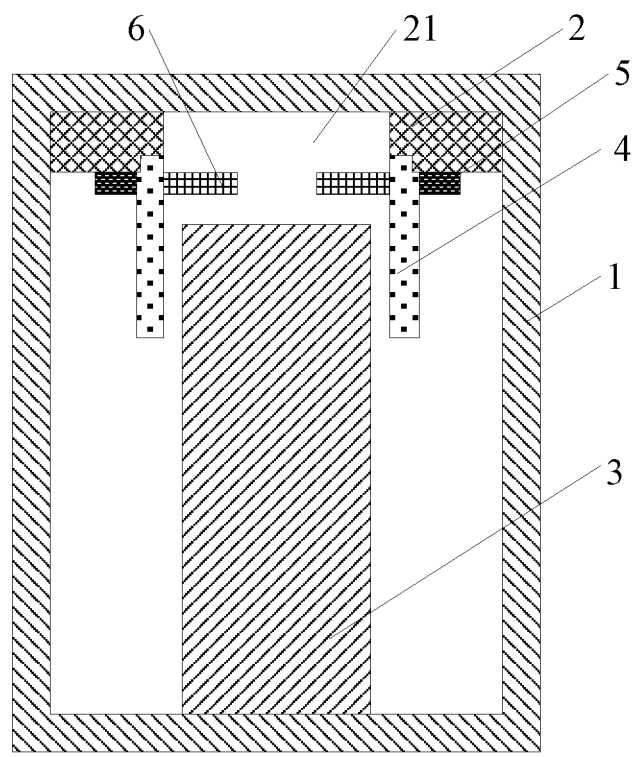
FIG. 5 is a section view of another combiner according to an embodiment of the present application.

Referring to FIG. 5, in the first implementation, the combiner further includes a second conductor 6.

The second conductor 6 is located inside the third conductor 5, is fastened to the inner side surface of the first conductor 4, and a partial region of a side surface of the second conductor 6 is opposite to an end surface of the other end of the conductive column 3.

The partial region of the side surface of the second conductor 6 and the end surface of the conductive column 3 form a capacitor structure. A signal that flows through the first conductor 4 may be filtered by using the capacitor structure, thereby increasing isolation of the combiner without changing a size of the combiner.

The third conductor 5 and the second conductor 6 are coplanar. The second conductor 6 may be made of metal. For example, the second conductor 6 may be a copper foil. The first conductor 4, the second conductor 6, and the third conductor 5 may be integrally molded.

Figure 6:
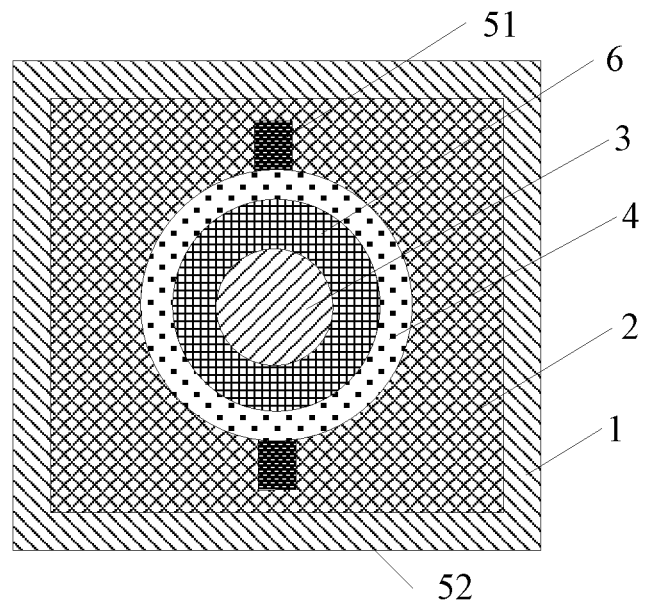
FIG. 6 is a section view of a top part of another combiner according to an embodiment of the present application.
Figure 7:
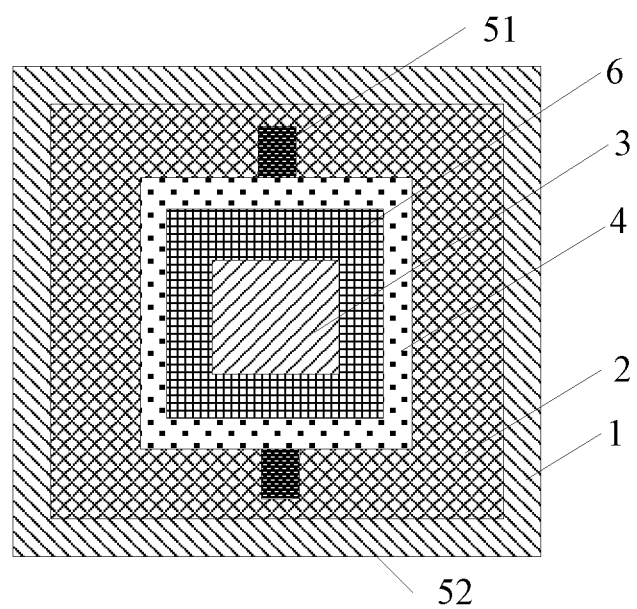
FIG. 7 is a section view of a top part of another combiner according to an embodiment of the present application.

Referring to FIG. 6 or FIG. 7, the second conductor 6 may be of an annular structure, for example, may be of a square ring structure or a circular ring structure, and an outer edge of the second conductor 6 is fastened to an inner side surface of the first conductor 4.

Figure 8:
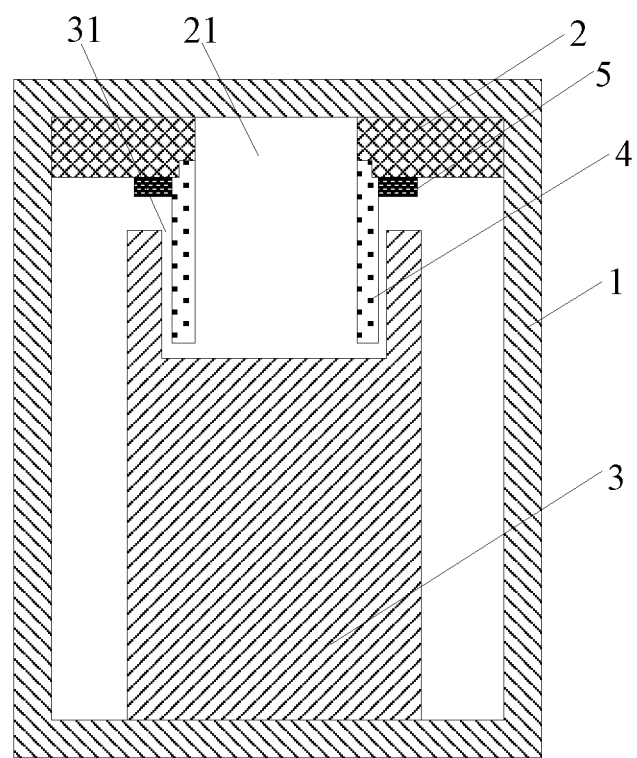
FIG. 8 is a section view of another combiner according to an embodiment of the present application.

Referring to FIG. 8, in a second implementation, a groove 31 is disposed in an end surface of the other end of the conductive column 3, and the other end of the first conductor 4 extends into the groove 31.

Figure 9:
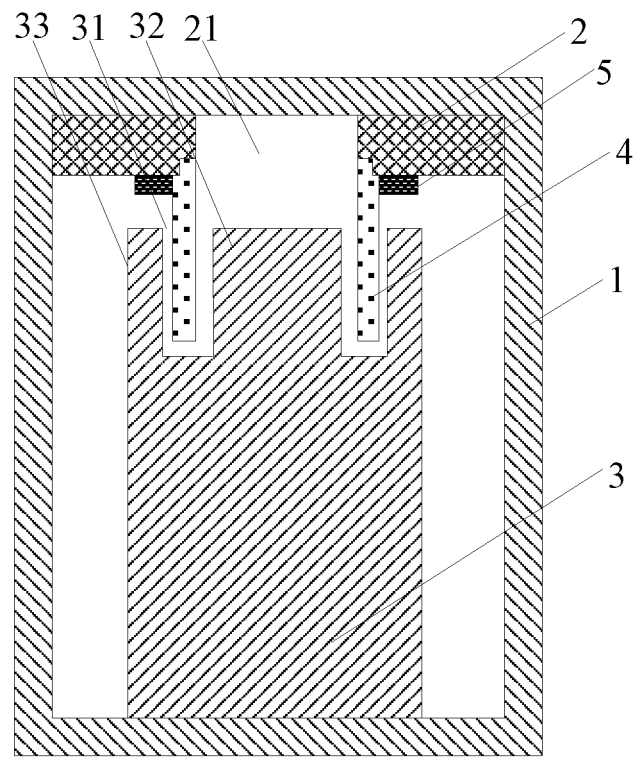
FIG. 9 is a section view of another combiner according to an embodiment of the present application.

Referring to FIG. 9, the groove 31 may be a tubular groove 31.

Figure 10:
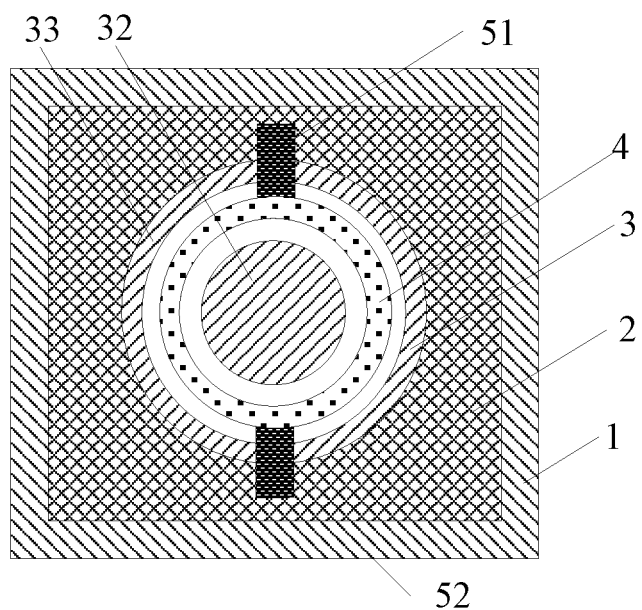
FIG. 10 is a section view of a top part of another combiner according to an embodiment of the present application.
Figure 11:
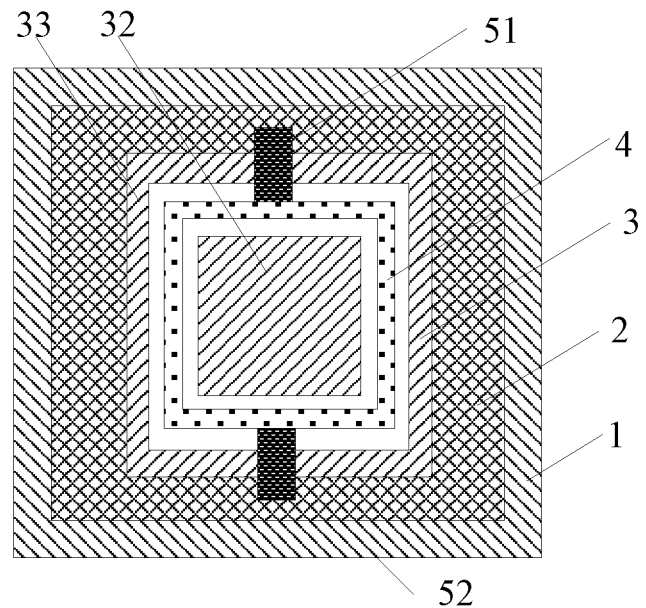
FIG. 11 is a section view of a top part of another combiner according to an embodiment of the present application.

In addition, referring to FIG. 10 and FIG. 11, the tubular groove 31 divides the other end of the conductive column 3 into a column center part 32 and a periphery part 33; the other end of the first conductor 4 extends into the tubular groove 31; and the column center part 32 also extends into the first conductor 4.

The other end of the first conductor 4 extends into the tubular groove 31, so that a partial region of the inner side surface of the first conductor 4 is opposite to a side surface of the column center part 32, and a partial region of the outer side surface of the first conductor 4 is opposite to an inner side surface of the periphery part 33. In this way, a size of a capacitor structure formed between the first conductor 4 and the conductive column 3 is increased, so as to greatly increase capacitance intensity of the capacitor structure, and further increase isolation of the combiner without changing a size of the combiner.

Referring to FIG. 3 or FIG. 4, the first conductor 4 may be of a cylindrical structure, or the first conductor 4 may be of a square tube-shaped structure.

When the first conductor 4 is of a cylindrical structure, the conductive column 3 is of a cylinder structure correspondingly, the opening 21 is a circular opening correspondingly, the second conductor 6 is of a circular ring structure correspondingly, and the groove 31 is a cylindrical groove correspondingly or the tubular groove 31 is a cylindrical groove correspondingly.

When the third conductor 5 is of a square tube-shaped structure, the conductive column 3 is of a square column structure correspondingly, the opening 21 is a square opening correspondingly, the second conductor 6 is a square ring structure correspondingly, and the groove 31 is a square columnar groove correspondingly or the tubular groove 31 is a square tube-shaped groove correspondingly.

For the first conductor 4 of a sheet structure, there may be the following two implementation examples for the first conductor 4: a first implementation example and a second implementation example.

Figure 12:
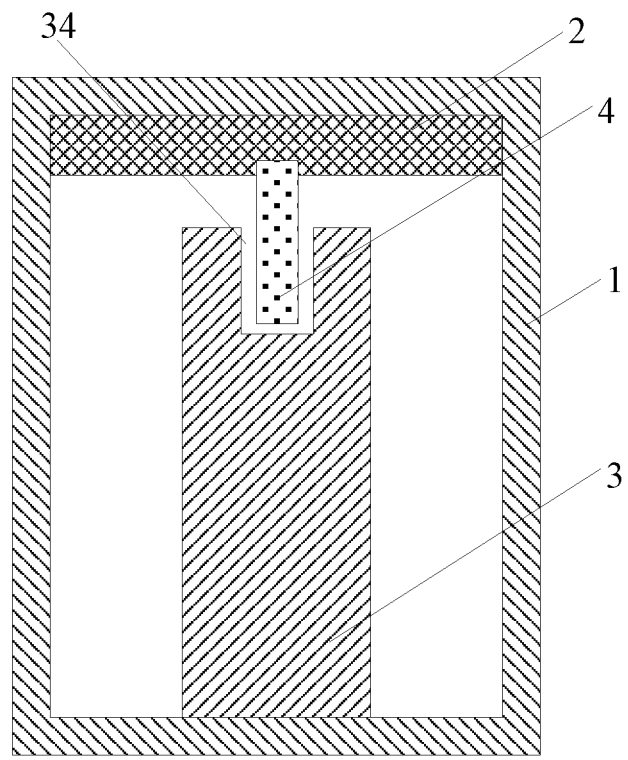
FIG. 12 is a section view of another combiner according to an embodiment of the present application.

Referring to FIG. 12, in the first implementation example, the first conductor 4 is a conductor of a sheet structure, and an upper edge of the first conductor 4 is fastened to the PCB 2.

The upper edge of the first conductor 4 is embedded into a side surface that is close to the conductive column 3 and that is of the PCB 2.

Figure 13:
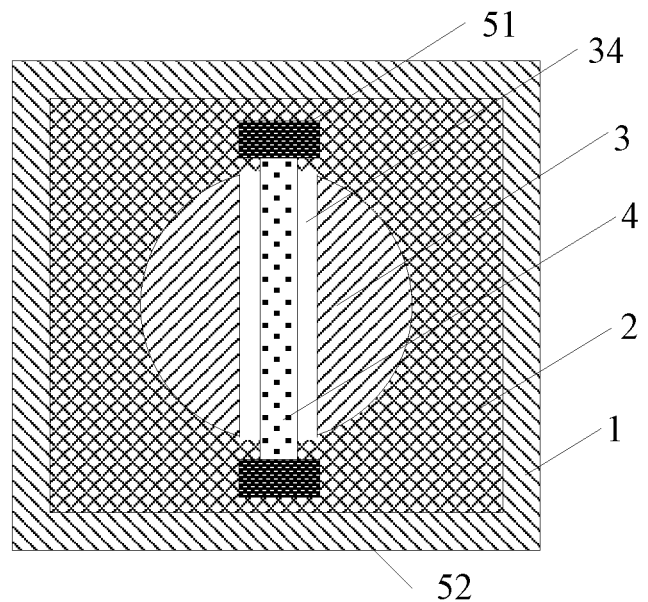
FIG. 13 is a section view of a top part of another combiner according to an embodiment of the present application.
Figure 14:
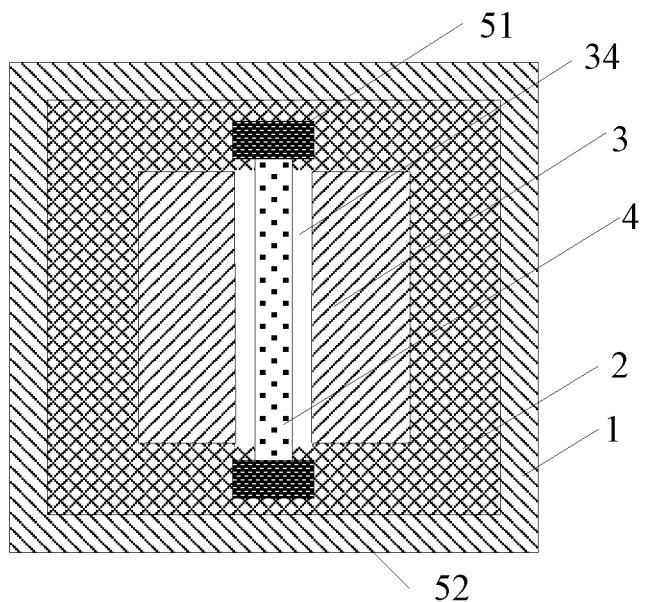
FIG. 14 is a section view of a top part of another combiner according to an embodiment of the present application.

In the first implementation example, referring to FIG. 13 or FIG. 14, a first groove 34 is disposed in an end surface of the other end of the conductive column 3, and a lower edge of the first conductor 4 extends into the first groove 34. Optionally, the conductive column 3 may be a circular conductive column or may be a square conductive column.

Still referring to FIG. 13 or FIG. 14, both the third conductive sheet 51 and the fourth conductive sheet 52 that are included in the third conductor 5 are fastened to a side surface that is close to the conductive column 3 and that is of the PCB 2, and are respectively connected to two side edges of the first conductor 4.

A lower edge of the first conductor 4 extends into the first groove 34, so that a partial region of a side surface of the first conductor 4 is opposite to the conductive column 3, and a partial region of the other side surface thereof is opposite to the conductive column 3. In this case, a capacitor structure formed between the first conductor 4 and the conductive column 3 is increased, so as to increase capacitance intensity of the capacitor structure, and further increase isolation of the combiner without changing a size of the combiner.

Figure 15:
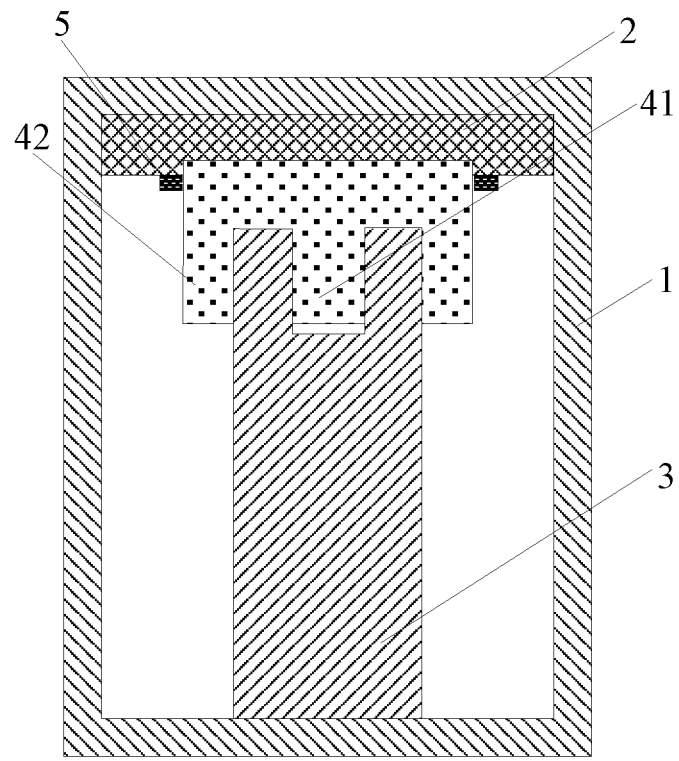
FIG. 15 is a section view of another combiner according to an embodiment of the present application.

Referring to FIG. 15, in the second implementation example, the first conductor 4 includes a first conductive sheet 41 and a second conductive sheet 42 that are of sheet structures; an upper edge of the first conductive sheet 41 is fastened into the PCB 2, an upper edge of the second conductive sheet 42 is fastened into the PCB 2; and the first conductive sheet 41 and the second conductive sheet 42 cross with each other.

The upper edge of the first conductive sheet 41 is embedded into a side surface that is close to the conductive column 3 and that is of the PCB 2, and the upper edge of the second conductive sheet 42 is embedded into a side surface that is close to the conductive column 3 and that is of the PCB 2.

The first conductive sheet 41 and the second conductive sheet 42 may be perpendicular to each other. The first conductive sheet 41 and the second conductive sheet 42 each may be perpendicular to the PCB 2.

Figure 16:
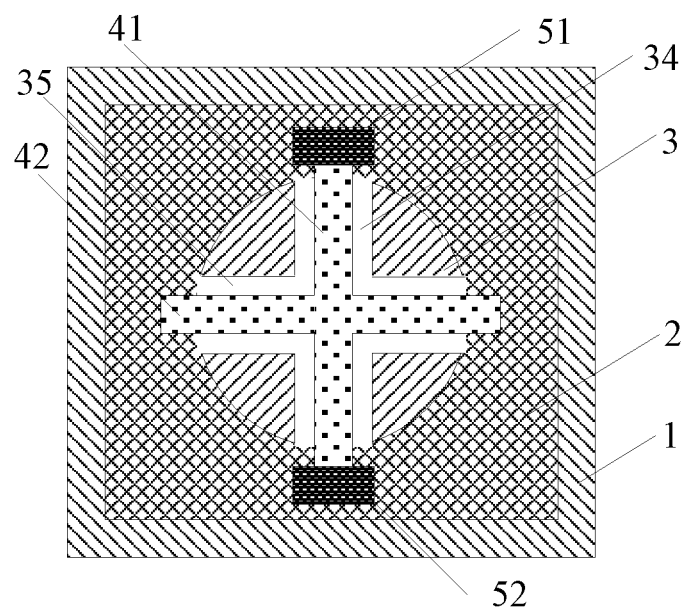
FIG. 16 is a section view of a top part of another combiner according to an embodiment of the present application.
Figure 17:
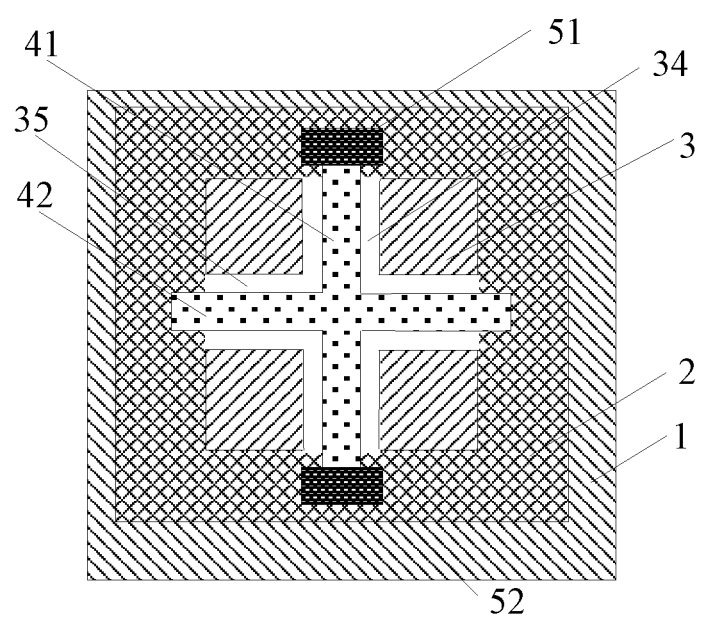
FIG. 17 is a section view of a top part of another combiner according to an embodiment of the present application.

In the second implementation example, referring to FIG. 16 or FIG. 17, a first groove 34 and a second groove 35 are disposed in an end surface of the other end of the conductive column 3; the first groove 34 and the second groove 35 cross with each other; a lower edge of the first conductive sheet 41 extends into the first groove 34; and a lower edge of the second conductive sheet 42 extends into the second groove 35.

In addition, the conductive column 3 may be a cylindrical conductive column, a square conductive column, or a column of another structure. A first groove 34 and a second groove 35 are perpendicular to each other.

The lower edge of the first conductive sheet 41 extends into the first groove 34, so that a partial region of a side surface of the first conductive sheet 41 is opposite to the conductive column 3, and a partial region of the other side surface thereof is opposite to the conductive column 3; and the lower edge of the second conductive sheet 42 extends into the second groove 35, so that a partial region of a side surface of the second conductive sheet 42 is opposite to the conductive column 3, and a partial region of the other side surface thereof is opposite to the conductive column 3. In this case, a size of a capacitor structure formed between the first conductor 4 and the conductive column 3 is greatly increased, so as to increase capacitance intensity of the capacitor structure, and further greatly increase isolation of the combiner without changing a size of the combiner.

Still referring to FIG. 16 or FIG. 17, the third conductive sheet 51 and the fourth conductive sheet 52 included in the third conductor 5 are fastened to a surface that is close to the conductive column 3 and that is of the PCB 2, and are respectively connected to two side edges of the first conductive sheet 41.

In this embodiment of the present application, the axial direction of the first conductor is parallel to the axial direction of the conductive column, and a partial region of a side surface of the first conductor is opposite to the conductive column. In this way, the first conductor may be opposite to a side surface and another part of the conductive column. Because an area of the side surface and another part of the conductive column is larger than that of an end part of the conductive column, a size of a capacitor structure formed between the side surface of the first conductor and the conductive column can be increased, so as to increase capacitance intensity of the capacitor structure without changing a size of the combiner, thereby increasing isolation of the combiner. In addition, capacitance intensity of a capacitor structure formed between the first conductor and the conductive column can be flexibly changed by changing a size of the first conductor. A size of the combiner may also be decreased, and even if the size of the combiner is decreased, it can also be ensured that the isolation of the combiner is not affected.

Figure 18:
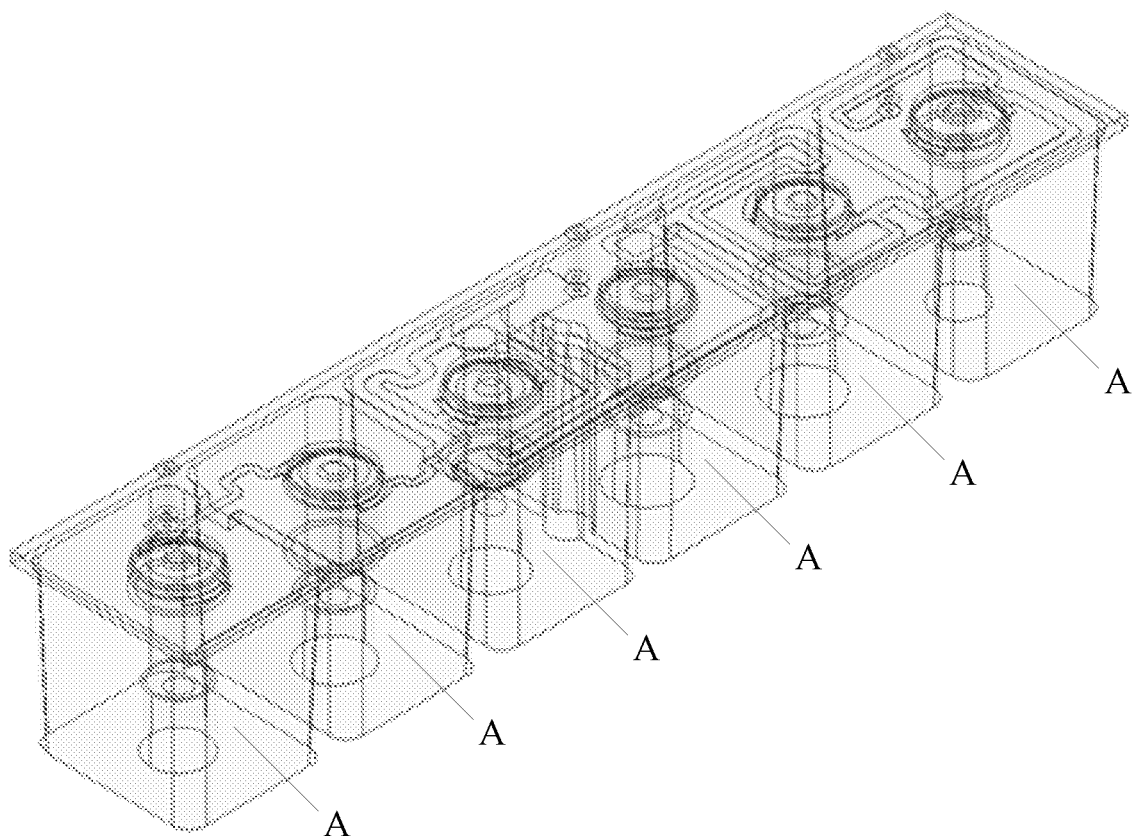
FIG. 18 is a schematic structural diagram of an antenna apparatus according to an embodiment of the present application.

Referring to FIG. 18, an embodiment of the present application provides an antenna apparatus, where the antenna apparatus includes at least one combiner A connected in series, and each of the at least one combiner A is any combiner according to the foregoing embodiment.

In this embodiment of the present application, an axial direction of a first conductor included in each combiner is parallel to an axial direction of a conductive column, and a partial region of a side surface of the first conductor is opposite to the conductive column. In this way, the first conductor may be opposite to a side surface and another part of the conductive column. Because an area of the side surface and another part of the conductive column is larger than that of an end part of the conductive column, a size of a capacitor structure formed between the side surface of the first conductor and the conductive column can be increased, so as to increase capacitance intensity of the capacitor structure, and increase isolation of the combiner without changing a size of the combiner, thereby increasing isolation of the antenna apparatus.

A person skilled in the art will readily figure out other implementation solutions of the present application after referring to this specification and practicing implementation solutions of the present application herein. This application is intended to cover any variation, application, or adaptive change of the present application, and the variation, application, or adaptive change follows a general principle of the present application and includes common general knowledge or conventional technical means in the technical field in the present application and a non-present application. This specification and the embodiments are only considered as examples, and the true scope and spirit of the present application are indicated by the claims below.

It should be understood that the present application is not limited to the precise structures described above and shown in the accompanying drawings, and various modifications and variations can be made to the present application without departing from the scope of the present application. The scope of the present application is limited only by the appended claims.

What is claimed is:

1. A combiner comprising: a conductive housing, a printed circuit board (PCB), a conductive column, and a first conductor;
   wherein the PCB, the conductive column, and the first conductor are located inside the conductive housing;
   one end of the conductive column is fastened to a bottom part of the conductive housing, the PCB is fastened to a top part of the conductive housing, and the first conductor is fastened to the PCB; and
   an axial direction of the first conductor is parallel to an axial direction of the conductive column, and a partial region of a side surface of the first conductor is opposite to the conductive column.

2. The combiner according to claim 1, wherein the first conductor is of a tubular structure, one end of the first conductor is fastened to the PCB, and a partial region of at least one of an inner side surface and an outer side surface of the first conductor is opposite to the conductive column.

3. The combiner according to claim 2, wherein a groove is disposed in an end surface of the other end of the conductive column, and the other end of the first conductor extends into the groove.

4. The combiner according to claim 3, wherein the groove is a tubular groove, and the conductive column is located in a column center part of the tubular groove and extends into the first conductor.

5. The combiner according to claim 4, wherein the tubular groove is a cylindrical groove or a square tube-shaped groove.

6. The combiner according to claim 2, wherein an axis of the first conductor is collinear with an axis of the conductive column.

7. The combiner according to claim 2, wherein the first conductor is of a cylindrical structure or a square tube-shaped structure.

8. The combiner according to claim 1, wherein an area of a cross section of the first conductor is greater than that of a cross section of the conductive column, and the other end of the conductive column extends into the first conductor.

9. The combiner according to claim 8, further comprising: a second conductor, wherein the second conductor is fastened to an inner side surface of the first conductor, and a partial region of a side surface of the second conductor is opposite to an end surface of the other end of the conductive column.

10. The combiner according to claim 1, the first conductor is of a sheet structure, and an upper edge of the first conductor is fastened to the PCB; and a groove is disposed in an end surface of the other end of the conductive column, and a lower edge of the first conductor extends into the groove.

11. The combiner according to claim 10, wherein the first conductor comprises a first conductive sheet and a second conductive sheet, and the first conductive sheet and the second conductive sheet cross with each other;
   both an upper edge of the first conductive sheet and an upper edge of the second conductive sheet are fastened to the PCB; and
   a first groove and a second groove are disposed in the end surface of the other end of the conductive column, the first groove and the second groove cross with each other, a lower edge of the first conductive sheet extends into the first groove, and a lower edge of the second conductive sheet extends into the second groove.

12. The combiner according to claim 11, wherein the first conductive sheet is perpendicular to the second conductive sheet.

13. The combiner according to claim 1, wherein the combiner further comprises a third conductor, the third conductor is fastened to a side surface that is close to the conductive column, wherein the side surface is of the PCB, and the third conductor is connected to the first conductor.

14. The combiner according to claim 13, wherein the third conductor comprises a third conductive sheet and a fourth conductive sheet, and both the third conductive sheet and the fourth conductive sheet are fastened to a side surface that is close to the conductive column, wherein the side surface is of the PCB; and
   both the third conductive sheet and the fourth conductive sheet are connected to the first conductor, and the first conductor is located between the third conductive sheet and the fourth conductive sheet.

15. An antenna apparatus comprising: at least one combiner connected in series, each of the at least one the combiner comprises a conductive housing, a printed circuit board (PCB), a conductive column, and a first conductor;
   wherein the PCB, the conductive column, and the first conductor are located inside the conductive housing;

one end of the conductive column is fastened to a bottom part of the conductive housing, the PCB is fastened to a top part of the conductive housing, and the first conductor is fastened to the PCB; and an axial direction of the first conductor is parallel to an axial direction of the conductive column, and a partial region of a side surface of the first conductor is opposite to the conductive column.

16. The antenna apparatus according to claim 15, wherein the first conductor is of a tubular structure, one end of the first conductor is fastened to the PCB, and a partial region of at least one of an inner side surface and an outer side surface of the first conductor is opposite to the conductive column.

17. The antenna apparatus according to claim 15, wherein an area of a cross section of the first conductor is greater than that of a cross section of the conductive column, and the other end of the conductive column extends into the first conductor.

18. The antenna apparatus according to claim 15, wherein the combiner further comprises a second conductor; the second conductor is fastened to an inner side surface of the first conductor, and a partial region of a side surface of the second conductor is opposite to an end surface of the other end of the conductive column.

19. The antenna apparatus according to claim 16, wherein a groove is disposed in an end surface of the other end of the conductive column, and the other end of the first conductor extends into the groove.

20. The antenna apparatus according to claim 19, wherein the groove is a tubular groove, and the conductive column is located in a column center part of the tubular groove and extends into the first conductor.

* * * * *